(12) United States Patent
Golightly et al.

(10) Patent No.: US 7,046,518 B2
(45) Date of Patent: May 16, 2006

(54) POWER MODULE

(75) Inventors: Alan Frederik Golightly, Redondo Beach, CA (US); William Grant, Fountain Valley, CA (US)

(73) Assignee: International Rectifier Corporation, El Segundo, CA (US)

( * ) Notice: Subject to any disclaimer, the term of this patent is extended or adjusted under 35 U.S.C. 154(b) by 214 days.

(21) Appl. No.: 10/114,541

(22) Filed: Apr. 1, 2002

(65) Prior Publication Data

US 2002/0196609 A1 Dec. 26, 2002

Related U.S. Application Data

(60) Provisional application No. 60/280,908, filed on Apr. 2, 2001.

(51) Int. Cl.
*H05K 1/14* (2006.01)

(52) U.S. Cl. .............................. 361/736; 257/706

(58) Field of Classification Search ................ 361/704, 361/705, 707, 709, 715, 730, 752, 723, 728, 361/734, 775, 679; 257/706, 707, 720–724
See application file for complete search history.

(56) References Cited

U.S. PATENT DOCUMENTS

| | | | | |
|---|---|---|---|---|
| 4,788,765 A | * | 12/1988 | Kaufman et al. | ............. 29/827 |
| 4,899,256 A | * | 2/1990 | Sway-Tin | .................... 361/715 |
| 5,043,859 A | * | 8/1991 | Korman et al. | ............. 363/147 |
| 5,536,972 A | * | 7/1996 | Kato | ........................... 257/706 |
| 5,747,876 A | * | 5/1998 | Majumdar et al. | ........... 257/687 |
| 5,959,842 A | * | 9/1999 | Leonard et al. | ............. 361/752 |
| 5,966,291 A | | 10/1999 | Baumel et al. | ............. 361/707 |
| 6,166,464 A | | 12/2000 | Grant | ........................ 310/68 R |
| 6,189,203 B1 | * | 2/2001 | Heinrich et al. | ............... 29/606 |
| 6,272,015 B1 | * | 8/2001 | Mangtani | ..................... 361/707 |
| 6,441,520 B1 | * | 8/2002 | Grant | ........................ 310/68 R |
| 6,445,584 B1 | * | 9/2002 | Riehl et al. | .................. 361/707 |
| 6,465,875 B1 | * | 10/2002 | Connah et al. | ............. 257/666 |
| 2002/0167828 A1 | * | 11/2002 | Parkhill et al. | ............. 363/144 |

* cited by examiner

*Primary Examiner*—Kamand Cuneo
*Assistant Examiner*—Thanh S. Phan
(74) *Attorney, Agent, or Firm*—Ostrolenk, Faber, Gerb & Soffen, LLP

(57) ABSTRACT

A power module that houses components of a circuit for driving a three-phase motor. The power module includes a molded shell. A number of leads are embedded within the body of the power shell and extend from its exterior where they make electrical connection to exterior devices to a chamber within the molded shell where they are connected to respective components of the circuit. The power module includes capacitor leads, which are embedded in the molded shell, for making direct connection to respective bus capacitors, thereby allowing the capacitors to be directly assembled onto the power shell and become part of the power module. The leads embedded within the molded shell are arranged so that they pass over one another within the body of the molded shell. At least one of the leads has a portion within the chamber which acts as bridge to allow the passage of conductors.

20 Claims, 20 Drawing Sheets

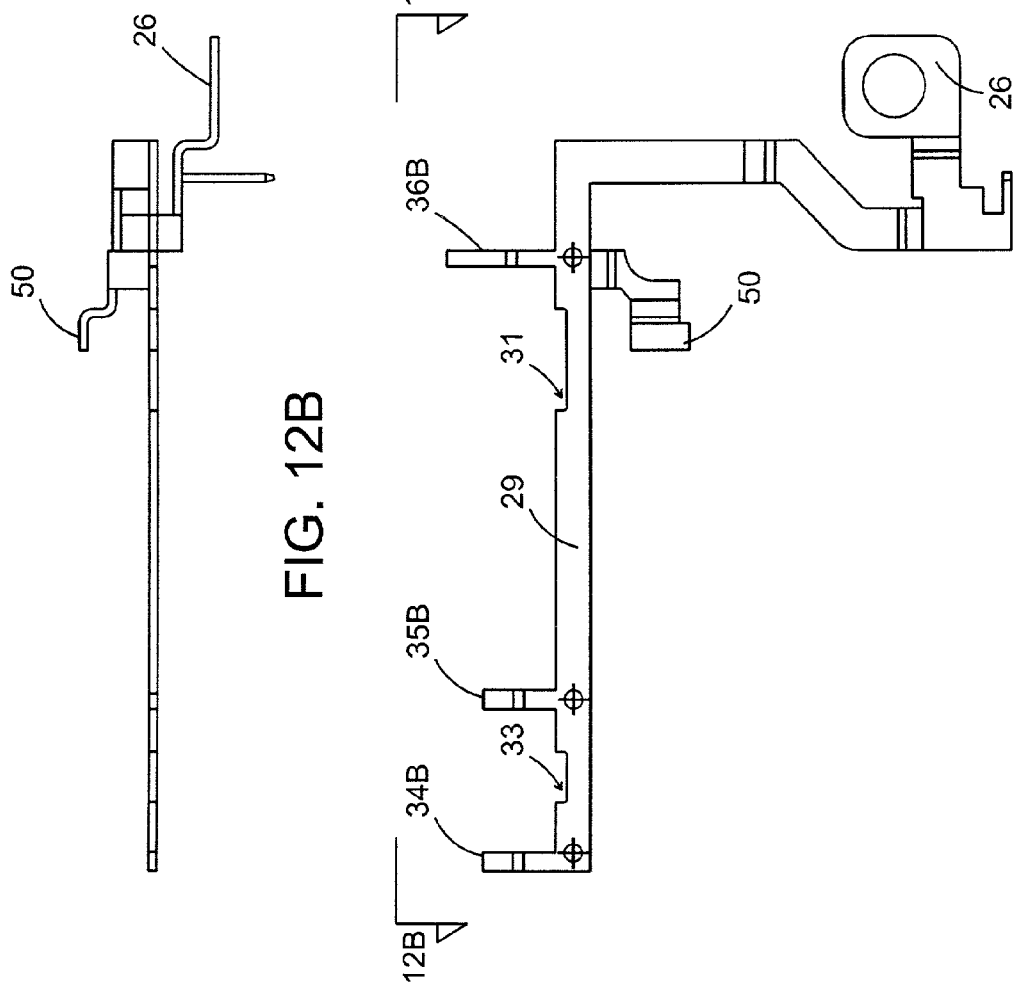

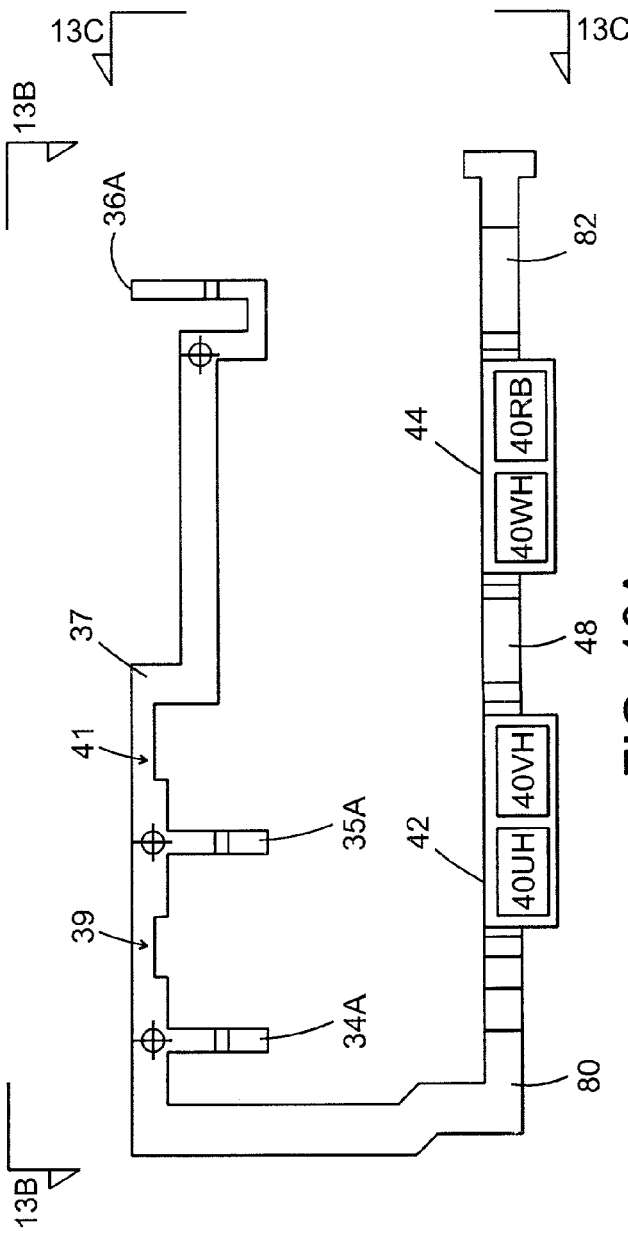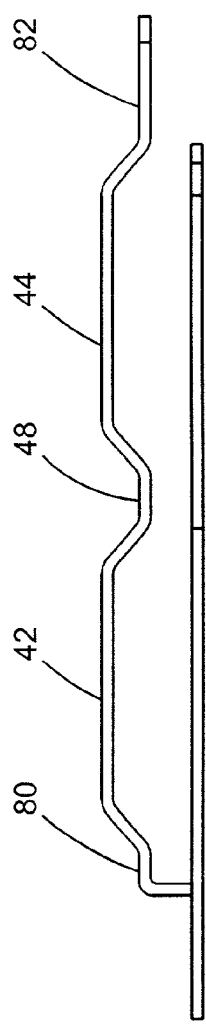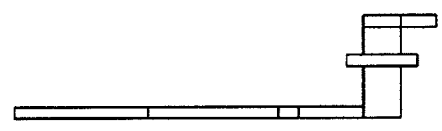

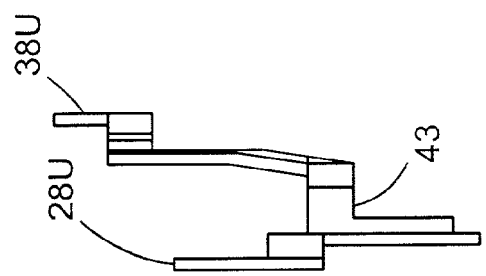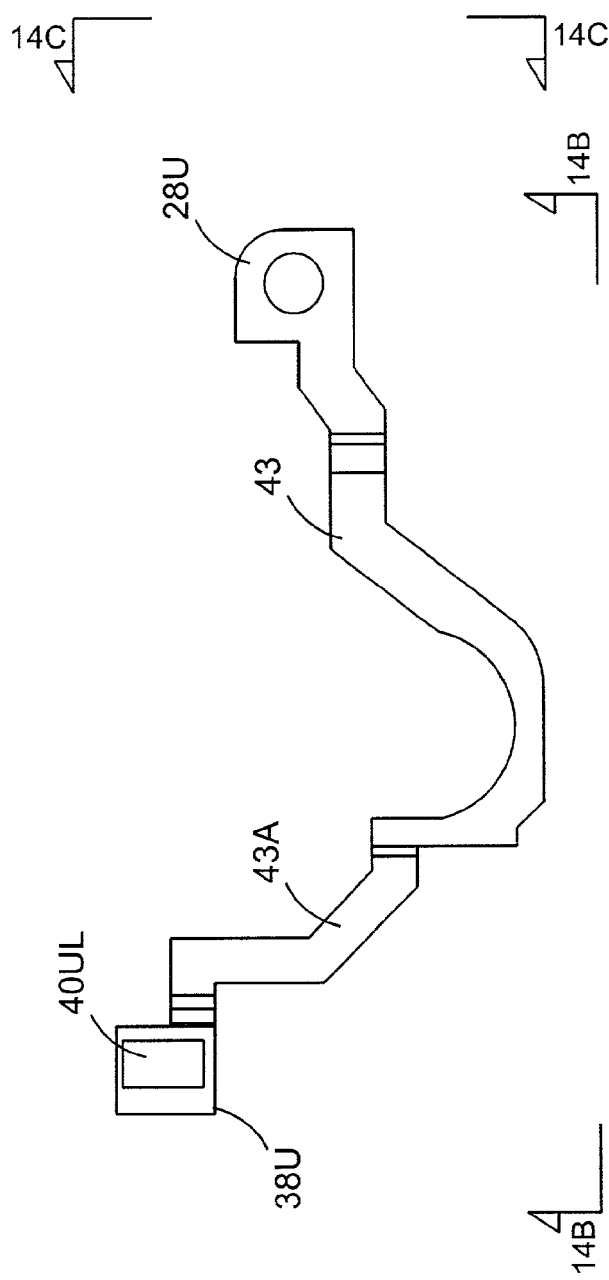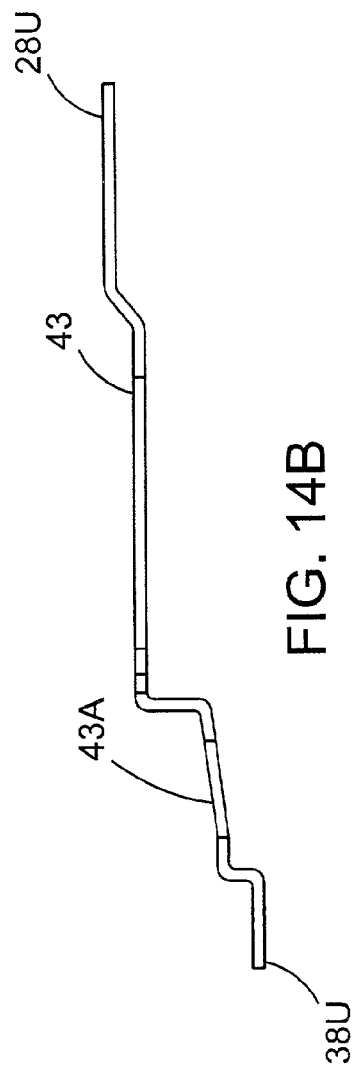

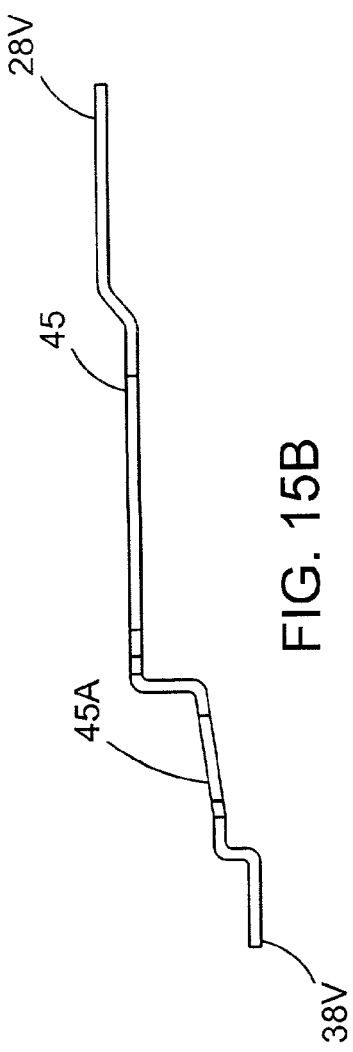
FIG. 15C
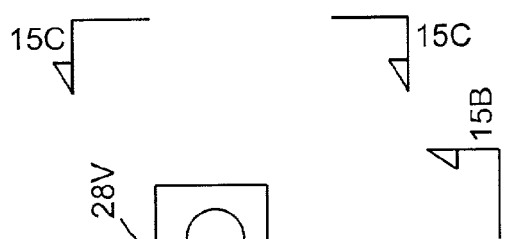
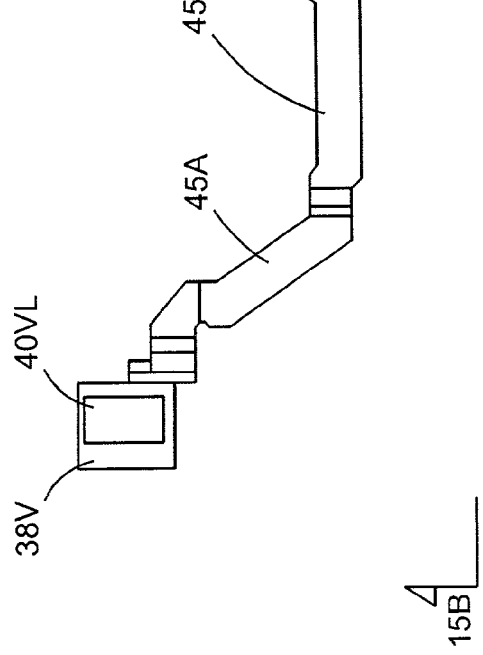
FIG. 15A
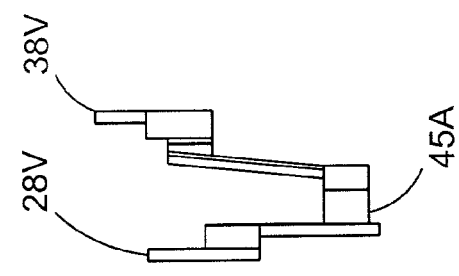
FIG. 15B

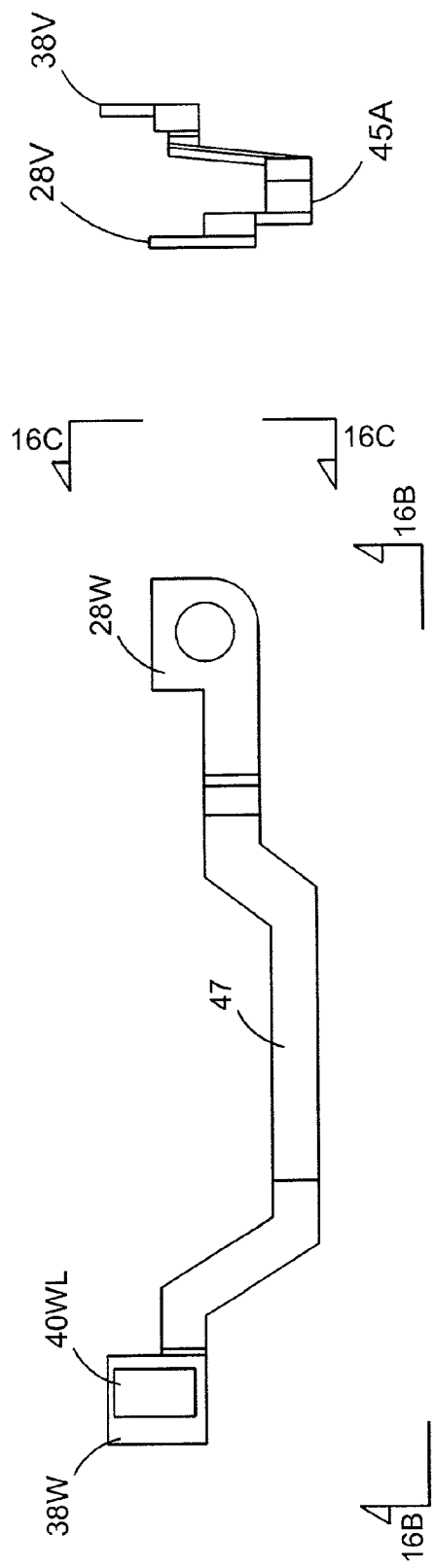
FIG. 16A
FIG. 16B
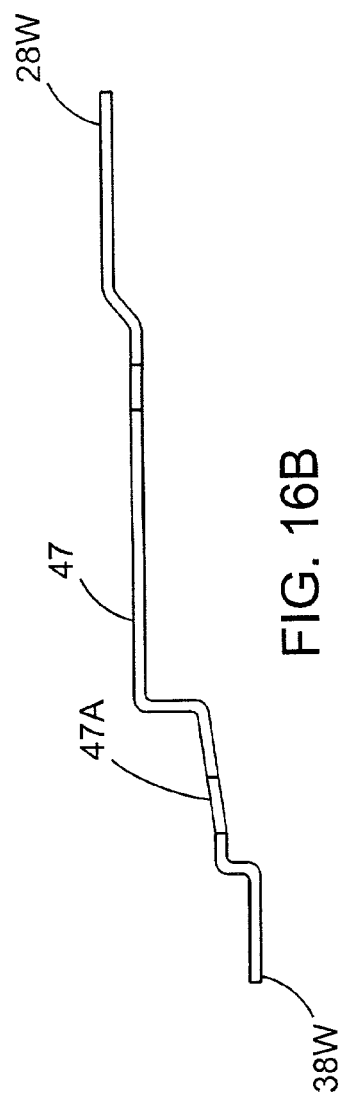
FIG. 16C

POWER MODULE

RELATED APPLICATION

This application is based on and claims benefit of U.S. Provisional Patent Application No. 60/280,908, filed Apr. 2, 2001 entitled POWER MODULE, the disclosure of which is hereby incorporated by reference and to which a claim of priority is hereby made.

THE FIELD OF THE INVENTION

The present invention relates to a power module arrangement, and more particularly to an arrangement for a power module for driving a three phase motor.

BACKGROUND OF THE INVENTION

Prefabricated power modules are used extensively in various industries for housing the circuit elements of a power circuit for driving electrical or electromechanical devices. Power modules are particularly useful for housing the power supply circuit components for driving motors. As such, power modules are extensively used in the automotive industry for housing the drive components for various motors.

Among the factors considered in the design of a power module are its size and also its ability to manage the heat generated by the power elements contained therein. Efficient arrangement of the various elements of a power module may contribute to the reduction of the size of the module.

SUMMARY OF THE INVENTION

It is an object of the present invention to provide for a power module for housing elements of a power circuit for driving an electric motor. The disclosed module shows a novel arrangement for a power module. The disclosed power module is particularly suited for use in the automotive industry, but includes features which will be readily recognized by one skilled in the art as beneficial in various other fields of endeavor.

A power module according to the present invention includes a molded shell having a chamber in which elements of a power circuit for driving a three-phase motor are arranged. The power module includes a lead frame which includes a power lead, a ground lead, three terminal leads each being connectable to a respective phase of a three-phase motor, capacitor leads each being connectable directly to a respective connector of a bus capacitor, a jumper, and a lead having conductive pads for receiving a number of power devices.

According to one aspect of the present invention, bus capacitors are directly connected to the capacitor leads of the power module and thus are assembled onto the power module directly. This ensures a fast current response to each phase of the motor.

According to another aspect of the present invention, the various elements of the lead frame cross over one another within the body of the molded shell. This arrangement provides for a more efficient and compact positioning of the various elements of the lead frame and thus allows for a smaller power module.

According to yet another aspect of the present invention, at least one of the leads includes a bridge portion which passes over conductive traces on a power substrate. The bridge portion allows for the unhindered passage of conductive traces from one part of the substrate to another part of the substrate. This arrangement allows for a more compact positioning of various elements within the module and also allows the conductive traces to be positioned along a shortest possible path. That is, the traces need not be diverted along a complex path on the surface of the substrate, and therefor can be made as short as practicable. This in turn may lead to the reduction of the overall resistance and inductance of the power module.

Other features and advantages of the present invention will become apparent from the following description of the invention which refers to the accompanying drawings.

BRIEF DESCRIPTION OF THE DRAWINGS

FIG. 12A shows a top plan view of the ground lead in a power module according to the first embodiment of the present invention, FIG. 12B shows the ground lead shown in FIG. 12A viewed in the direction of line 12B—12B, and FIG. 12C shows the ground lead shown in FIG. 12A as viewed in the direction of line 12C—12C.

FIG. 13A shows a top plan view of a lead in a power module according to the first embodiment of the present invention, FIG. 13B shows the lead shown in FIG. 13A viewed in the direction of line 13B—13B, and FIG. 13C shows the lead shown in FIG. 13A as viewed in the direction of line 13C—13C.

FIG. 14A shows a top plan view of a terminal lead in a power module according to the first embodiment of the present invention, FIG. 14B shows the terminal lead shown in FIG. 14A viewed in the direction of line 14B—14B, and FIG. 14C shows the power lead shown in FIG. 14A as viewed in the direction of line 14C—14C.

FIG. 15A shows a top plan view of a terminal lead in a power module according to the first embodiment of the present invention, FIG. 15B shows the terminal lead shown in FIG. 15A viewed in the direction of line 15B—15B, and FIG. 15C shows the power lead shown in FIG. 15A as viewed in the direction of line 15C—15C.

FIG. 16A shows a top plan view of a terminal lead in a power module according to the first embodiment of the present invention, FIG. 16B shows the terminal lead shown in FIG. 16A viewed in the direction of line 16B—16B, and FIG. 16C shows the power lead shown in FIG. 16A as viewed in the direction of line 16C—16C.

DETAILED DESCRIPTION OF THE FIGURES

Figure 1:
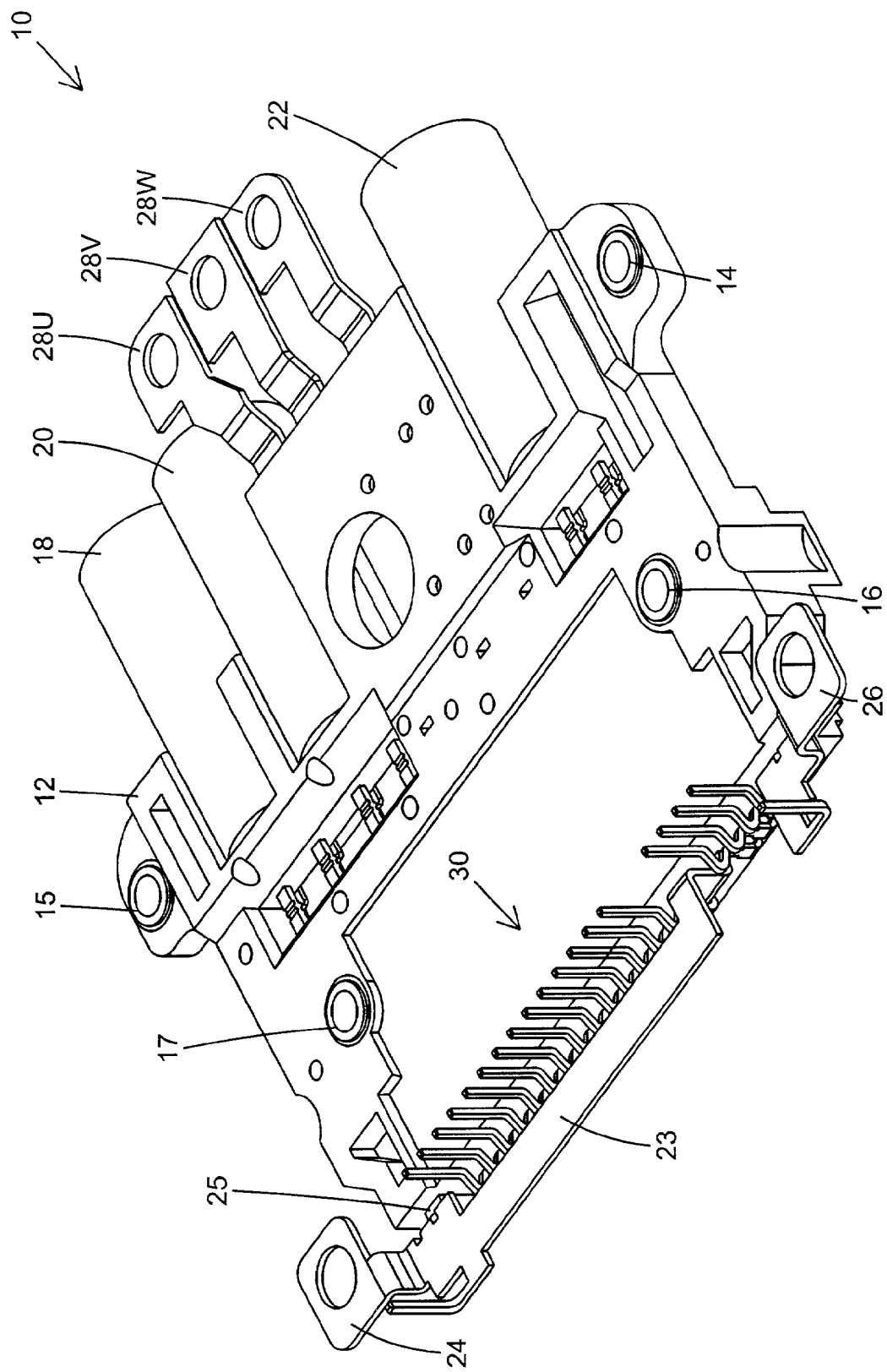
FIG. 1 shows a perspective view of the top of a power module according to the first embodiment of the present invention.

FIG. 1 shows a perspective top view of power module 10 according to the present invention. Power module 10 is preferably used to supply power to a three-phase brushless DC motor typically used in a hydraulic power steering system by switching power to the three phases of the motor. Power module 10 includes a molded shell 12 which provides structural support for the various components of power module 10 as well as electrical insulation and physical separation of the leads and other electrical components of power module 10. Molded shell 12 is of a unitary configuration and is preferably made from a resin, such as a plastic offered by Dow Chemical under the mark QUESTRA™ WA-552. Mounting bushings 14, 15 are disposed in molded shell to allow the mounting of power module 10 on a surface using mounting screws (not shown). Molded shell 12 also includes heat sink mounting bushings 16, 17 which can be used to optionally mount power module 10 on an external heat sink (not shown). Three bus capacitors 18, 20, 22 are directly assembled onto power module 10. Bus capacitors 18, 20, 22 are assembled to power module 10 in order to supply a fast current response to the phases of the motor. In the preferred embodiment bus capacitors 18, 20, 22 are 3900 μF electrolytic capacitors which are connected between the positive bus and the ground terminal of an inverter circuit (See FIG. 8). Power module 10 electrically interfaces with the positive terminal of a power source, such as a car battery, through power lead 24α and completes a closed circuit through ground lead 26. In the preferred embodiment, an aperture is provided in power lead 24 and ground lead 26 which allow these leads to be assembled to respective power input connectors (not shown) by a screw. Of course, other methods of assembly may be used for this purpose.

Power module 10 interfaces with the three phases of a motor through respective terminal leads 28U, 28V, 28W. Terminal lead 28U supplies power to a first phase of the motor (U phase), terminal lead 28V supplies power to the second phase of the motor (V phase) and terminal 28W supplies power to the third phase of the motor (W phase). Through terminal leads 28U, 28V, 28W current is switched to the respective phases of a three phase motor. In the preferred embodiment shown in FIG. 1, terminal leads 28U, 28V, 28W include respective apertures for receiving a screw so that they may be assembled onto the housing of the motor (not shown).

Current is switched to the respective phases of a three-phase motor through terminal leads 28U, 28V, 28W by controllably switching a plurality of power semiconductor devices (not shown) that are housed within power module 10 as will be discussed later. A control circuit (not shown) controls the switching of the power semiconductor devices. The control circuit interfaces with each one of the power semiconductor devices and other electrical components within power module 10 through eighteen control pins 30. The control pins 30 are arranged in a row along one side of the molded shell 12. The function of each pin will be discussed later.

Figure 2:
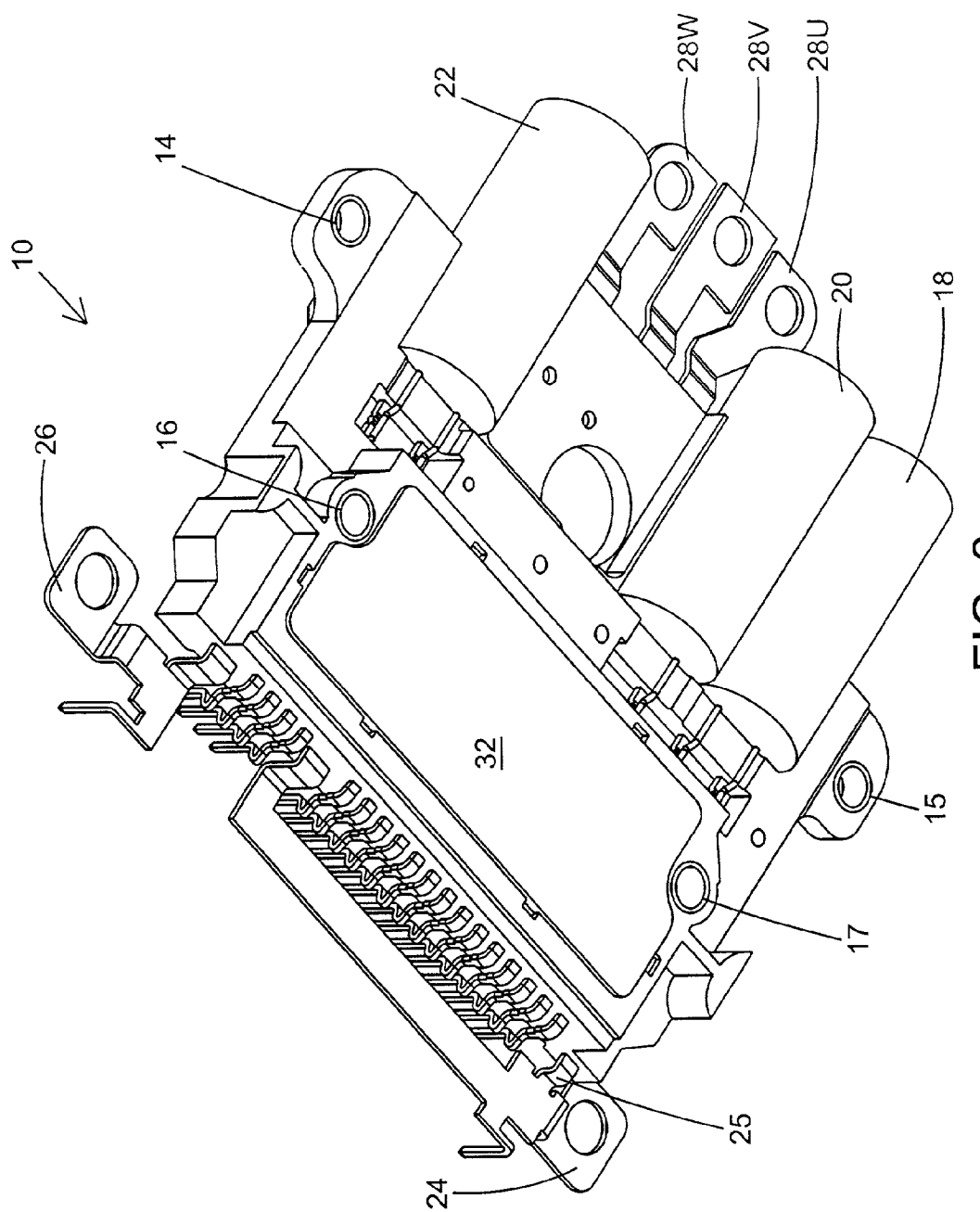
FIG. 2 shows a perspective view of the bottom of a power module according to the first embodiment of the present invention.

FIG. 2 shows a perspective bottom view of power module 10. In this view, the bottom portion of substrate 32 is shown. Substrate 32 may be an insulated metal substrate or some other substrate that can provide electrical isolation while providing good heat conductivity to dissipate the heat that may be generated by the power semiconductor devices contained within power module 10. As noted above, power module 10 may be optionally mounted on a heat sink using heat sink mounting holes 16, 17. When power module 10 is mounted on a heat sink, the bottom surface of substrate 32 is placed in intimate contact with the heat sink thereby improving heat dissipation. It should, however, be noted that a heat sink is not required in that the bottom of substrate 32 adequately dissipates heat into the ambient.

Figure 3:
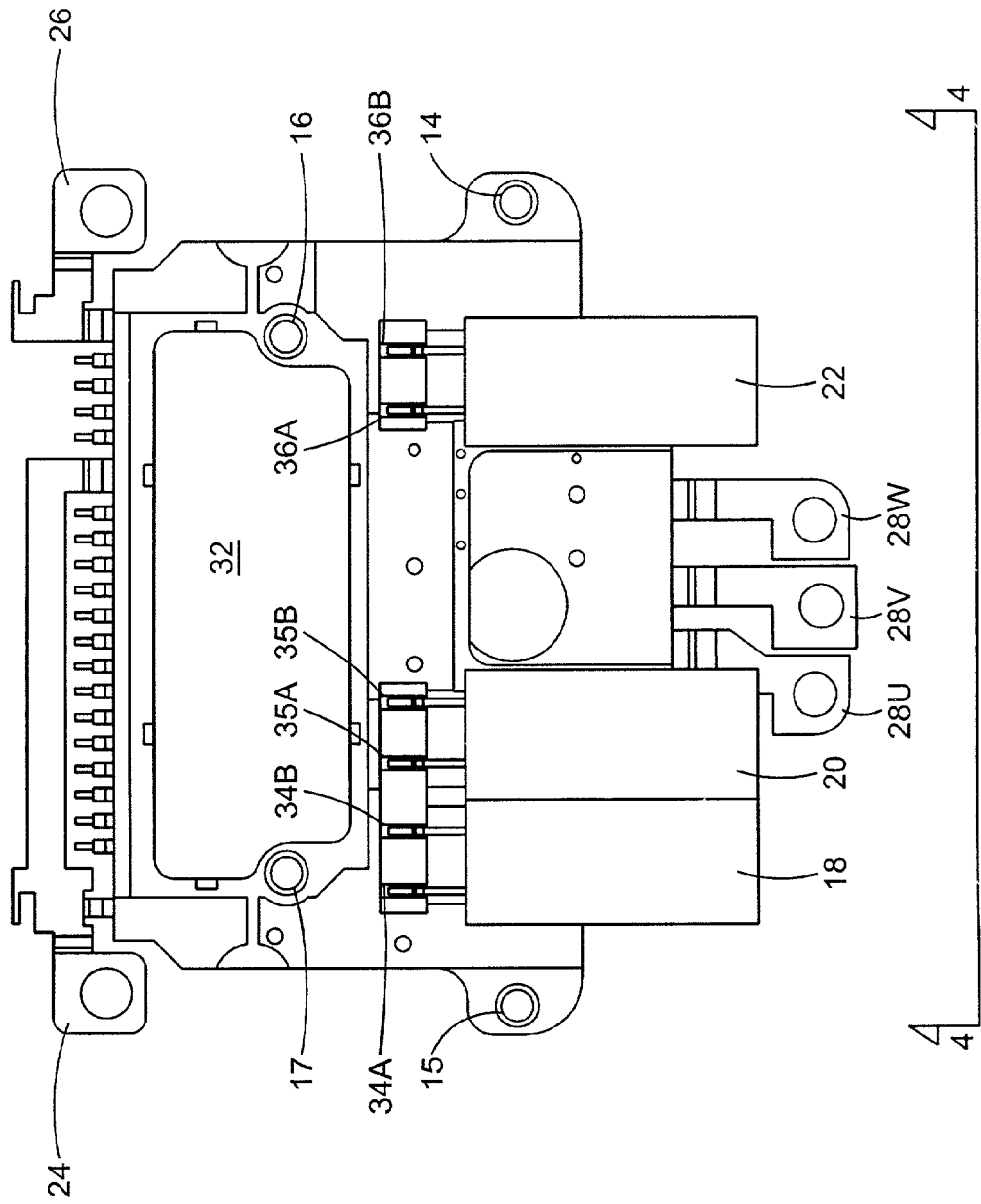
FIG. 3 shows a plan view of the bottom of a power module according to the first embodiment of the present invention.

FIG. 3 shows bus capacitors 18, 20, 22 connected directly to respective capacitor leads 34A, 34B, 35A, 35B, 36A, 36B. Capacitor leads 34A, 34B, 35A, 35B, 36A, 36B connect respective connectors of bus capacitors 18, 20, 22 to the positive bus and ground bus of the power circuit (shown later) contained within power module 10. In the preferred embodiment capacitor leads 34A, 35A, 36A connect to the positive bus while capacitor leads 34B, 35B, 36B connect to the ground via ground lead 24 as will be shown later in detail. Each capacitor lead 34A, 34B, 35A, 35B, 36A, 36B includes an aperture for receiving a respective connector of one of bus capacitors 18, 20, 22, thereby facilitating the direct assembly of bus capacitors 18, 20, 22 onto power module 10. It is to be understood, that other methods of connecting bus capacitors 18, 20, 22 to capacitor leads 34A, 34B, 35A, 35B, 36A, 36B can be employed to assemble directly bus capacitors 18, 20, 22 to power module 10.

Figure 4:
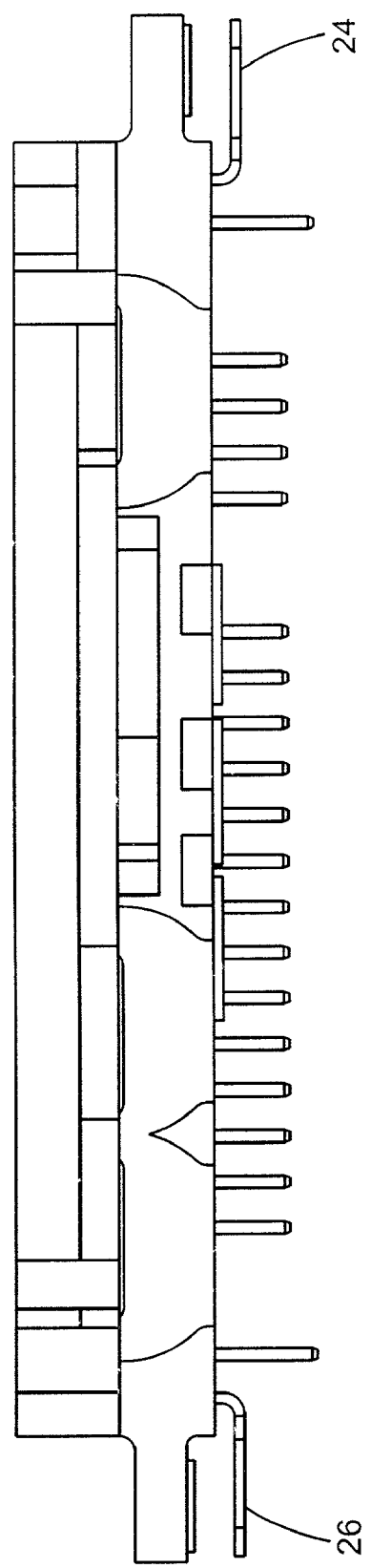
FIG. 4 shows a side view of a power module according to the first embodiment of the present invention viewed in the direction of line 4—4 in FIG. 3.

FIG. 4 shows power module 10 as viewed in the direction of line 4—4 of FIG. 3. In FIG. 4 bus capacitors 18, 20, 22 have been removed form view to illustrate their respective positions in power module 10.

Figure 5:
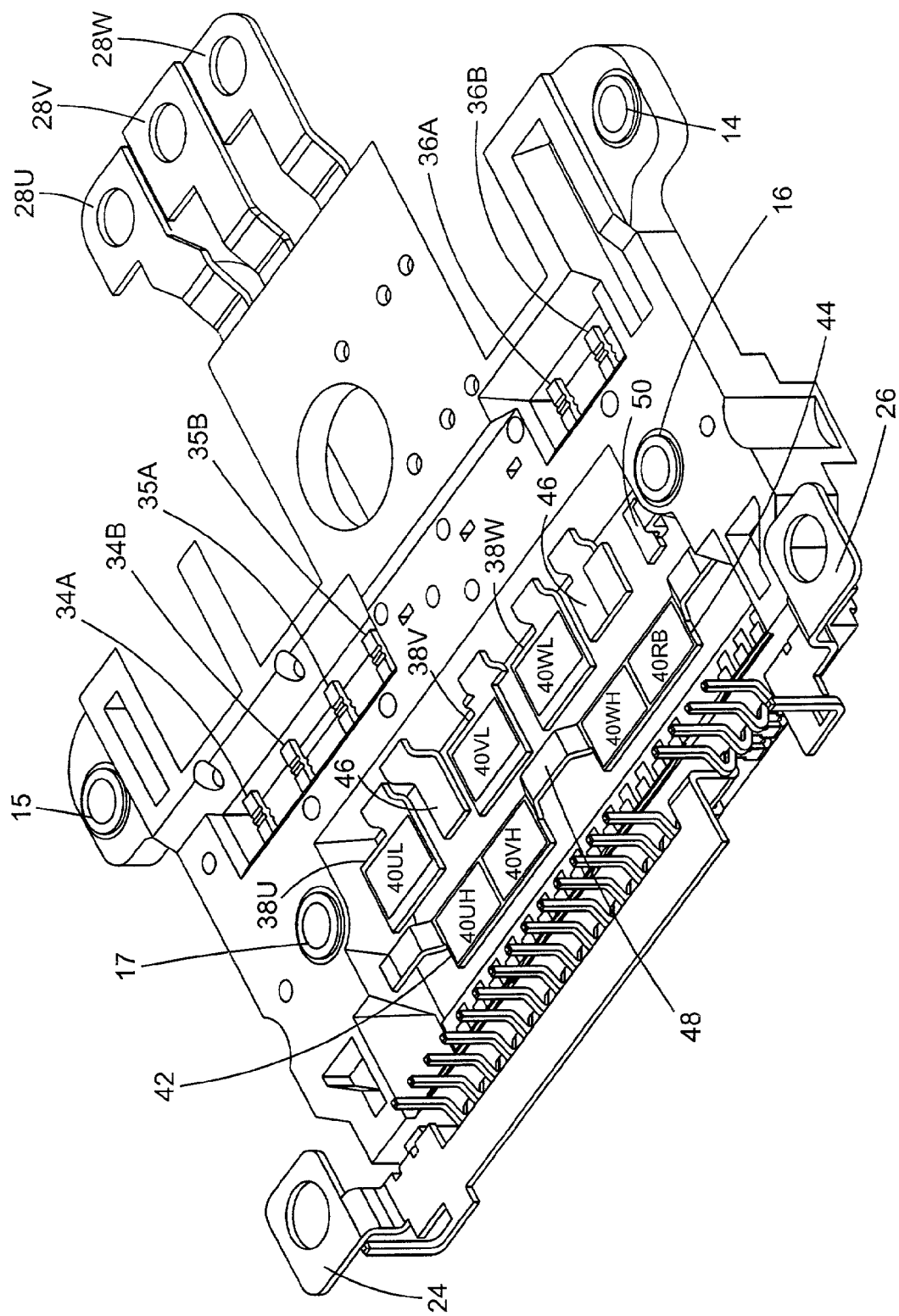
FIG. 5 shows a perspective view of a power module according to the first embodiment of the present invention excluding its substrate and capacitors.

Referring to FIG. 5, leads 24A, 24B, 24C are connected through molded shell 12 to conductive pads 38U, 38V, 38W, respectively. Power semiconductor devices 40UL, 40VL and 40WL are preferably power MOSFETs each having a drain electrode thereof electrically connected to a respective conductive pads 38U, 38V, 38W. Capacitor leads 34A, 35A, 36A are connected to conductive pads 42, 44, through molded shell 12. Disposed on and electrically connected to conductive pad 42 are power semiconductor devices 40UH, 40VH and disposed on and electrically connected to conductive pad 44 are power semiconductor devices 40WH, 40RB. Conductive pads 42, 44 are connected to one another via bridge 48.

Figure 6:
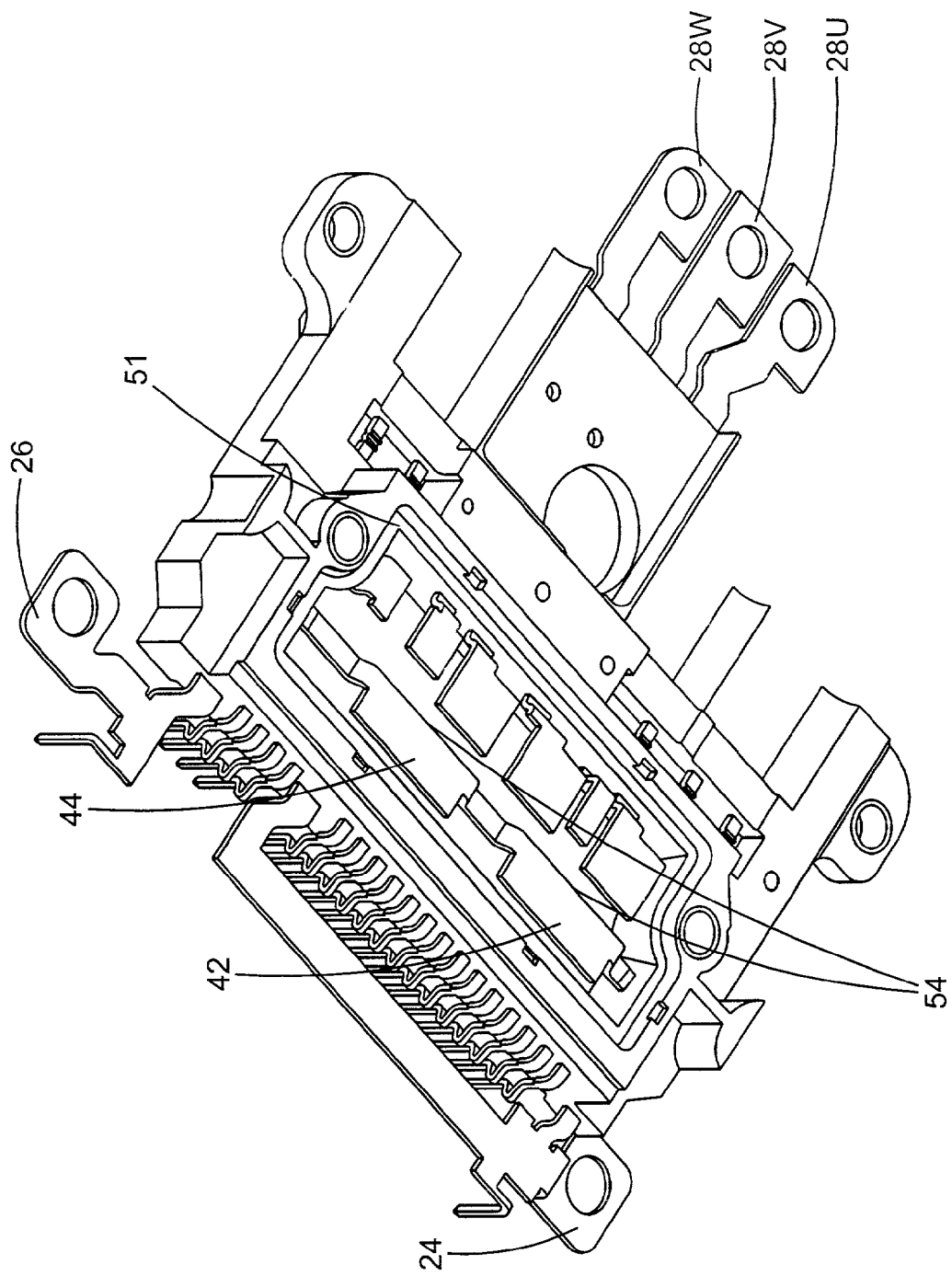
FIG. 6 shows a perspective view of a power module as viewed from the bottom excluding the capacitors and the substrate.

Also shown are jumper 46 which has two ends that are connected through a portion that is disposed within molded shell 12, and tab 50 which is connected to ground lead 24 through molded shell 12. It should be noted that conductive pads 38U, 38V, 38W, 42, 44, the ends of jumper 46 and tab 50 are all disposed within an opening 52 in molded shell 12, which forms a chamber that extends between the top surface to the bottom surface thereof. FIG. 6 shows bottom views of conductive pads 38U, 38V, 38W, 42, 44, the ends of jumper 46 and tab 50, thus illustrating that opening 52 extends through molded shell 12 from its top surface to its bottom surface. Also shown are corner fold downs 54. Corner fold downs 54 are folded portions of conductive pads, e.g. 42,44. Corner fold downs 54 make contact with substrate 32 when it is assembled in place, thereby spacing their associated conductive pads, e.g. 42,44 from substrate 32. Solder or some other conductive material is then disposed in the space between conductive pads, e.g. 42, 44 and substrate 32. Thus, corner fold downs 54 assist in the proper positioning of conductive pads, e.g. 42,44, of the lead frame above substrate 32.

Substrate 32 is disposed at the bottom and received by recess 51 at the bottom of opening 52. Once received by recess 51 substrate 32 is placed in contact with conductive pads 38UL, 38VL, 38WL, 42, 44 in order to withdraw heat from the power semiconductor devices disposed thereon.

Figure 7:
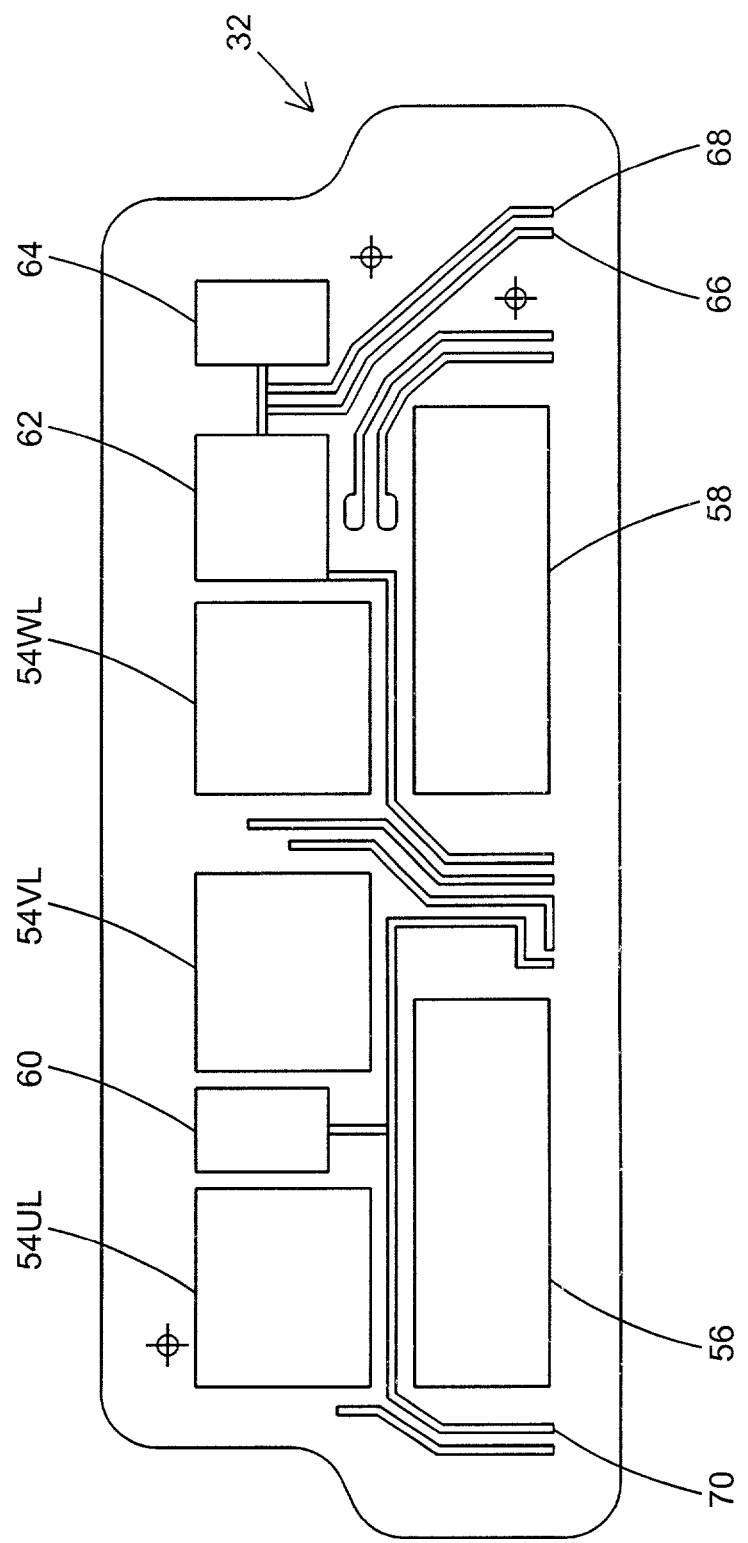
FIG. 7 shows a top plane view of the substrate used in a power module according to the first embodiment of the present invention.

FIG. 7 shows a top view of substrate 32. On its top surface, substrate 32 includes electrically isolated lands which are thermally connected to respective conductive pads when substrate 32 is installed at the bottom of opening 52. Specifically, lands 54UL, 54VL, 54WL, 56, 58 are thermally connected to conductive pads 38UL, 38VL, 38WL, 42, 44 respectively by a layer of solder or some other thermally conductive material. A plurality of conductive traces are also disposed on the top surface of substrate 32. The function of conductive traces is to facilitate electrical connection between control pins 30 and various components disposed within opening 52. Lands 60, 62 are provided on the top surface of substrate 32 to be connected to respective ends of jumper 46, and land 64 is provided to be connected with conductive tab 50. Land 62 and land 64 are connected to conductive traces 66, 68 and land 60 is connected to conductive trace 70.

Figure 8:
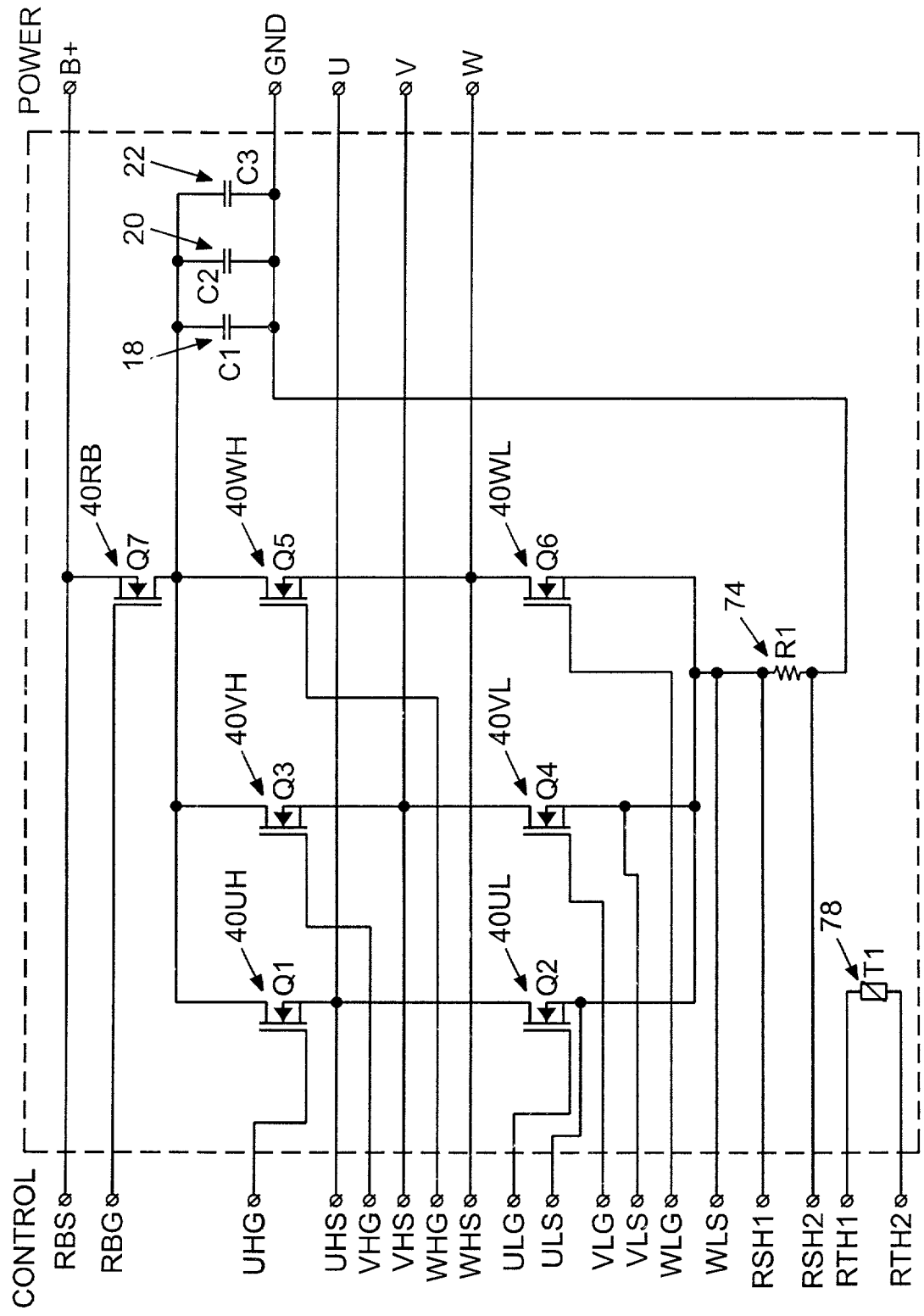
FIG. 8 shows the circuit diagram of portions of a power circuit embodied in the first embodiment of the power module according to the present invention.

Power module 10 provides a housing for the power components and related components of a circuit for driving a three phase motor. FIG. 8 illustrates a circuit diagram for the power and related components of a portion of a power circuit embodied in power module 10 according to the preferred embodiment of the present invention. Circuit 72 shown in FIG. 8 includes three inverter arrangements each for driving a respective phase of a three-phase motor. Each inverter arrangement includes a high side and a low side power semiconductor device, which may be preferably a MOSFET.

Specifically, circuit 72 includes high side power semiconductor devices 40UH, 40VH, 40WH that are electrically coupled to respective low side power semiconductor devices 40UL, 40VL, 40WL to form three inverter circuits. Power semiconductor devices 40UH, 40UL, 40VH, 40VL, 40WH, 40WL are preferably 40V MOSFETs sold by the assignee of the present invention under the trademark HEX™4.6$^D$. The three phases of a three phase motor are designated as U, V, W. Each phase of the three phase motor is connected to a respective pair of high side and low side power semiconductor devices. Specifically, the U phase is connected between power semiconductor devices 40UH, 40UL, the V phase is connected between power semiconductor devices 40VH, 40VL and the W phase is connected between power semiconductor devices 40WH, 40WL as shown in FIG. 8. It should be noted that since power semiconductor devices 40UH, 40UL, 40VH, 40VL, 40WH, 40WL are MOSFETs, to form an inverter arrangement the source electrode of the high side power semiconductor device is connected to the drain electrode of the low side power semiconductor device. In circuit 72, the source electrodes of the low side power semiconductor devices are connected together and then series connected through a current sensing resistor 74 to the ground. Current sensing resistor 74 is preferably a low inductance, 1 meg-ohm shunt resistor. Also, the drain electrodes of the high side power semiconductor devices are connected together and then series connected to the power bus through an N-channel MOSFET 40RB which provides protection against a reverse polarity condition. N-channel MOSFET 40RB is preferably a MOSFET sold by the assignee of the present application under the designation IRFC3703 HEXFET™.

Circuit 72 includes a thermistor 78 which is positioned on substrate 32 in order to provide temperature information from the same. Thermistor 78 is selected to preferably exhibit 10 kilo ohms of resistance at 25° C. with about 3% tolerance.

The various connections are set out on the left side of circuit 72. Table 1 provides a listing of these connections as designated in FIG. 8.

TABLE 1

| | |
|---|---|
| RBS | Source electrode of MOSFET 40RB |
| RBG | Gate electrode of MOSFET 40RB |
| UHG | Gate electrode of High Side MOSFET for U phase |
| UHS | Source electrode of high side MOSFET for V phase |
| VHG | Gate electrode of high side MOSFET for V phase |
| VHS | Source electrode of high side MOSFET for V phase |
| WHG | Gate electrode of high side MOSFET for W phase |
| WHS | Source electrode of high side MOSFET for W phase |
| ULG | Gate electrode of low side MOSFET for U phase |
| ULS | Source electrode of low side MOSFET for U phase |
| VLG | Gate electrode of low side MOSFET for V phase |
| VLS | Source electrode of low side MOSFET for V phase |
| WLG | Gate electrode for low side of W phase |
| WLS | Source electrode of low side for W phase |
| $RSH_1$ | First connection to current sense resistor |
| $RSH_2$ | Second connection to current sense resistor |
| $RTH_1$ | First connection to thermistor |
| $RTH_2$ | Second connection to thermistor |

Figure 9:
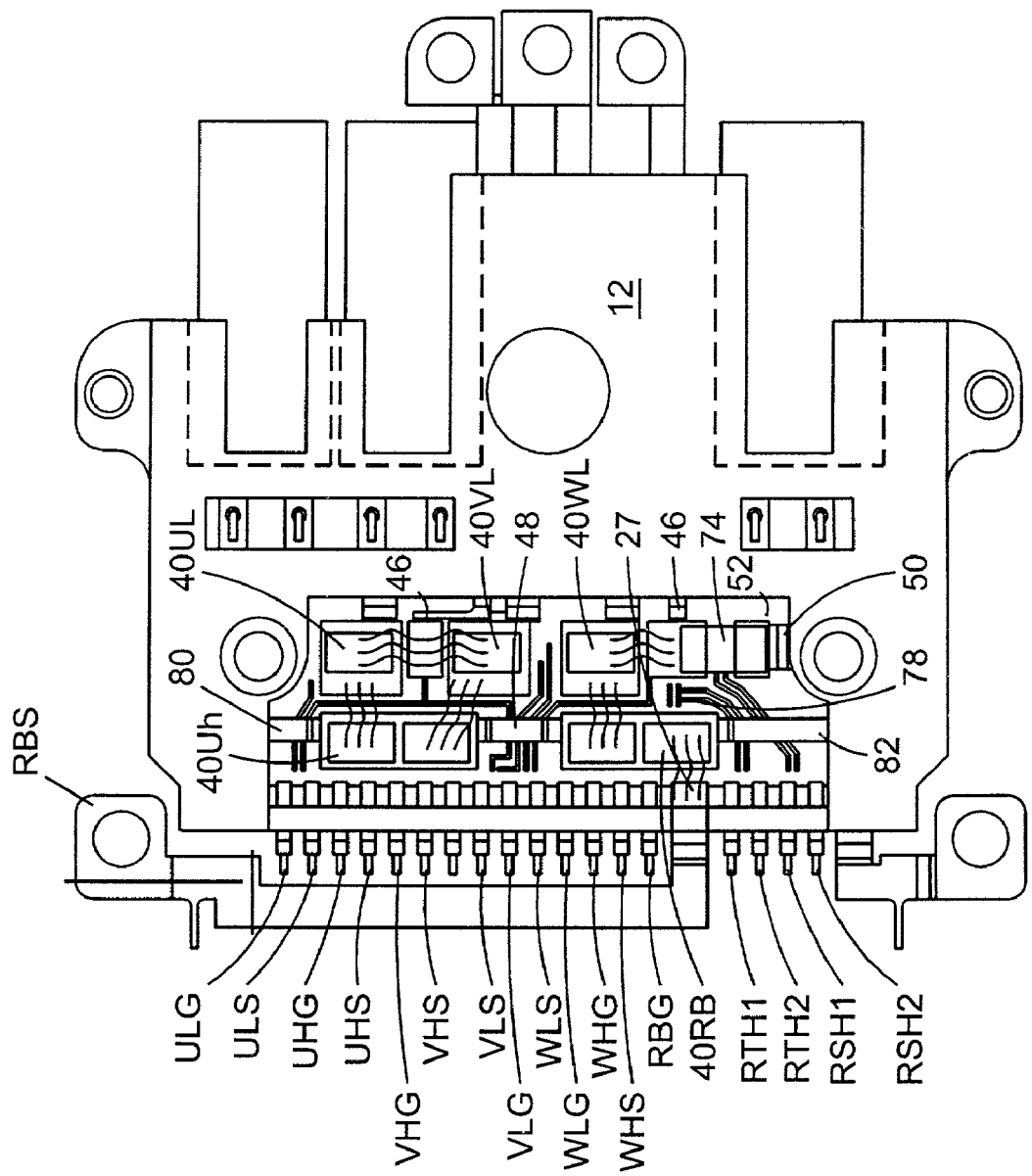
FIG. 9 shows a top plan view of a power module according to the first embodiment of the present invention.

Referring now to FIG. 9, a top view of power module 10 shows the various connections to control pins 30, which are in turn connected to a control circuit (not shown) for controlling the operation of the power components and other components disposed in opening 52 of molded shell 12. FIG. 9 also shows substrate 32 as disposed at the bottom of opening 52. As shown in FIG. 9, bridge 48 passes over a plurality of conductive traces disposed on top of substrate 32. Also shown are bridge portions 80, 82 which extend from respective edges of conductive pads 42, 44 over a plurality of conductive traces, e.g. 66, 68, on substrate 32 to the walls of opening 52 in molded shell 12. According to one aspect of the invention, bridge 48 and bridge portions 80, 82 allow the conductive traces to pass without interference to a place where they may make electrical connection to appropriate pins 30, thereby providing a more efficient arrangement. The various electrical connections between the components of circuit 72 are made using bondwires as shown in FIG. 9.

Figure 10:
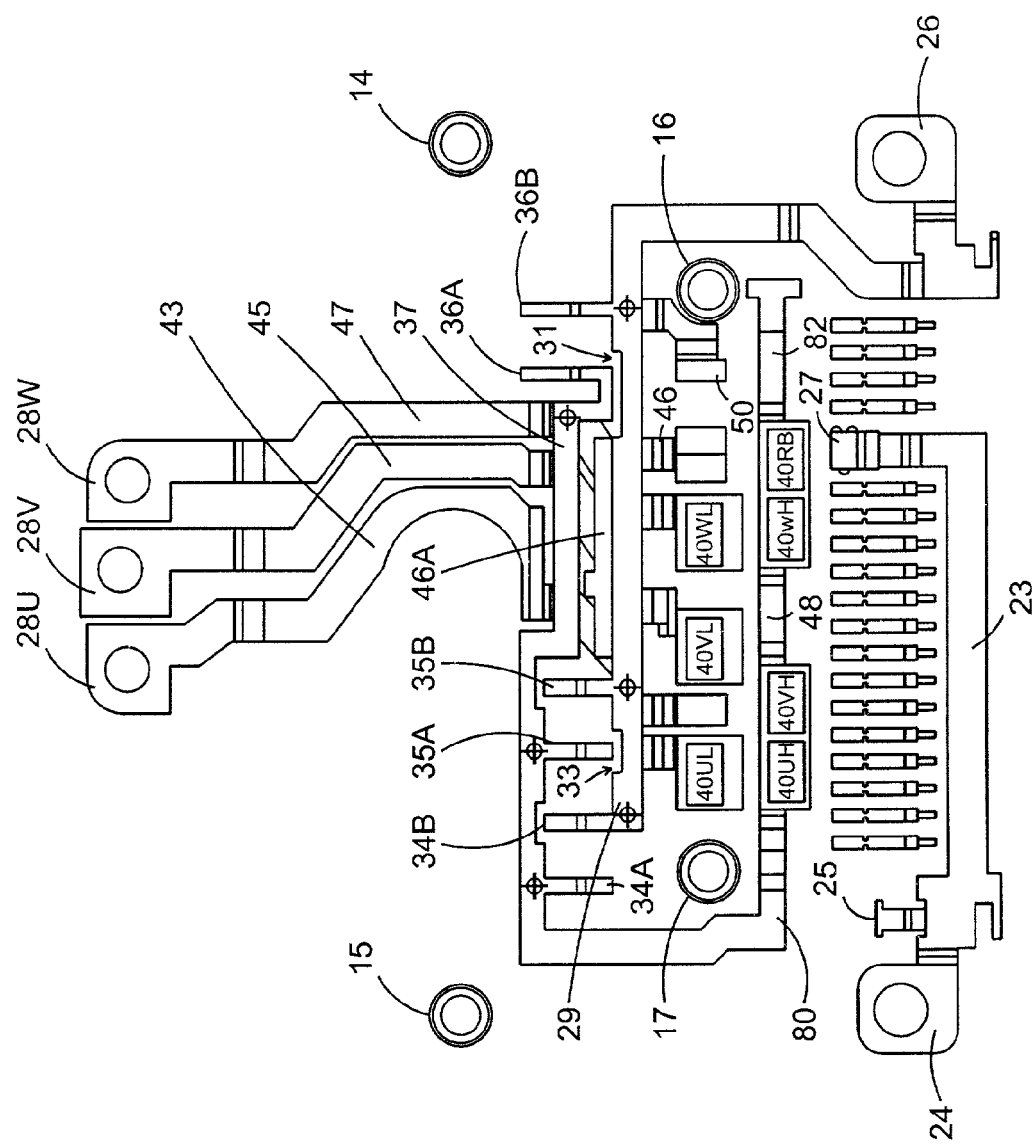
FIG. 10 shows a top plan view of the lead frame of a power module according to the first embodiment of the present invention.

Referring now to FIGS. 10–17C. The structure of the lead frame of power module 10 will now be described. FIG. 10 shows the lead frame of power module 10. In this Figure molded shell 12 has been removed to show the arrangements of the various leads within the body of molded shell 12.

Referring now to FIGS. 11A–17C, the structure of each lead will now be described.

Figure 11C:
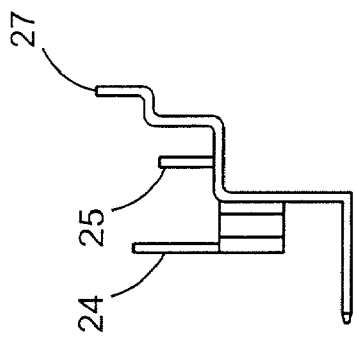
FIG. 11C shows the power lead shown in FIG. 11A as viewed in the direction of line 11C—11C.
Figure 11B:
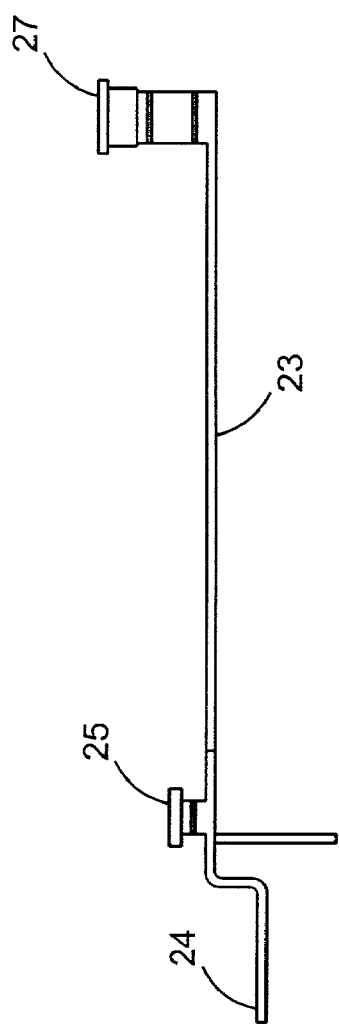
FIG. 11B shows the power lead shown in FIG. 11A viewed in the direction of line 11B—11B.
Figure 11A:
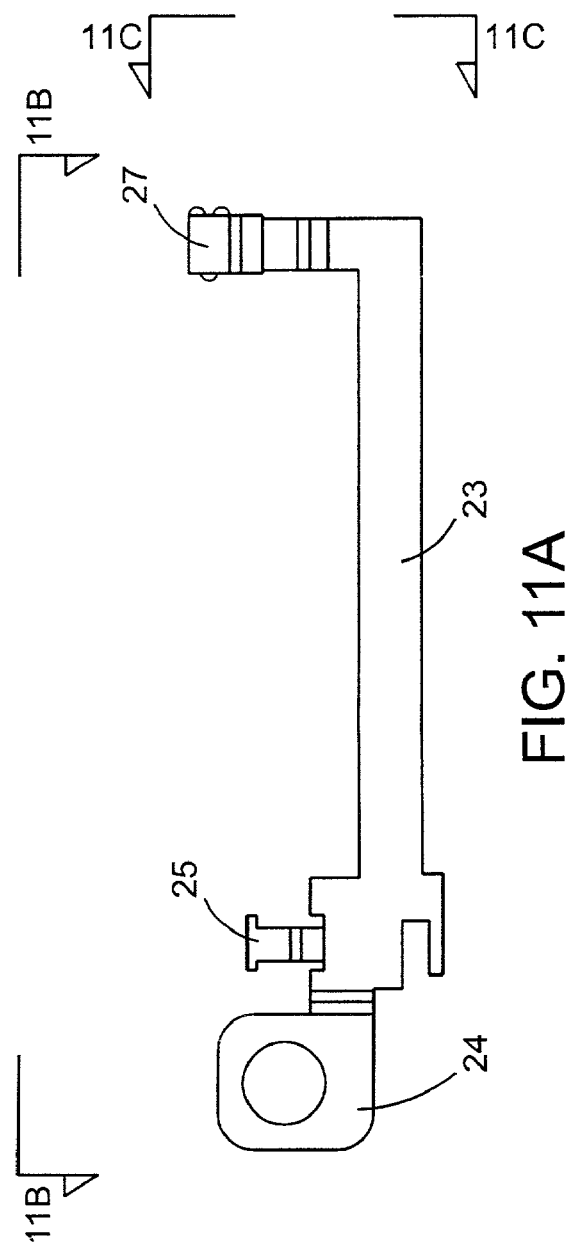
FIG. 11A shows a top plan view of the power lead in a power module according to the first embodiment of the present invention.

FIGS. 11A–11C show the various views of power lead 24. Power lead 24 includes an extension 23 connected to pad 27. Extension 23 extends along a side of power module 10 near the row of pins 30. Pad 27 extends at an angle from an edge of extension 23 through the body of molded shell 12 to the interior of opening 52 where it is electrically connected to the source electrode of MOSFET 40RB (see FIG. 9). Power lead 24 also includes anchor 25 which will be embedded in the body of molded shell 12 to further secure power lead 24 in position.

FIGS. 12A–12C shows the various views of ground lead 26. As shown in FIG. 12A, tab 50 extends at an angle from an edge of extension 29 through the body of molded shell 12, into the interior of opening 52 from a side wall thereof (FIG. 5). Capacitor leads 34b, 35B, 36B also extend from an edge of ground lead 26 in the same direction at a substantially right angle. Extension 29 has recessed portions 31, 33 formed on an edge thereof. The purpose of recessed portions 31, 33 of extension 29 will be described next with reference to FIGS. 13A–13C.

FIG. 13A shows capacitor leads 34A, 35A extending from a first edge of extension 37 at right angles, and capacitor lead 36A extending at a right angle from a second opposing edge of extension 37. Extension 37 also includes recessed portions 39, 41 formed on the first edge thereof as shown in FIG. 13A. Referring back to FIG. 10, capacitor leads 34A, 34B, 35A, 35B, 36A, 36B are arranged substantially parallel to one another on a common plane. Recessed portions 39, 41 accommodate the tips of capacitor leads 34B, 35B, respectively, while recessed portions 33, 31 accommodate the top of capacitor lead 35A and a portion of extension 37. This results in a more compact arrangement of leads in the lead frame.

Referring now to FIGS. 14A–14C, 15A–15C and 16A–16C. The structure of terminal leads 28U, 28V, 28W will now be described. Referring first to FIG. 14A terminal lead 28U includes extension 43 which is integral with conductive pad 36U. Extension 43 extends through the body of molded shell 12, and thus assists in heat management by withdrawing a portion of the heat from conductive pad 38U, on which power semiconductor device 40UL is disposed, and transmitting it to the exterior of power module 10 where it is dissipated. Extension 43 includes downwardly sloping portion 43A. As shown in FIG. 10, downwardly sloping portion 43A of extension 43 will be disposed underneath extensions 29, 37, thereby allowing for a more compact arrangement of the lead frame within the body of molded shell 12.

Referring now to FIGS. 15A–15C, terminal lead 26V includes extension 45 which is integrally connected with conductive pad 38V. Extension 45 extends through the body of molded shell 12, and thus assists in heat management by withdrawing a portion of the heat from conductive pad 38V, on which power semiconductor device 40VL is disposed, and transmitting it to the exterior of power module 10 where it is dissipated. Extension 45 includes downwardly sloping portion 45A. As shown in FIG. 10, downwardly sloping portion 445A of extension 45 will also be disposed underneath extension 29, 37, thereby allowing for a more compact arrangement of the lead frame within the body of molded shell 12.

Referring now to FIGS. 16A–16C, terminal lead 28W includes extension 47 which is integrally connected with conductive pad 38W. Extension 47 extends through the body of molded shell 12, and thus assists in heat management by withdrawing a portion of the heat from conductive pad 28V, on which power semiconductor device 40WL is disposed, and transmitting it to the exterior of power module 10 where it is dissipated. Extension 47 includes downwardly sloping portion 47A. As shown in FIG. 10, downwardly sloping portion 47A of extension 47 will also be disposed underneath extension 29, 37, thereby allowing for a more compact arrangement of the lead frame within the body of molded shell 12.

Figure 17C:
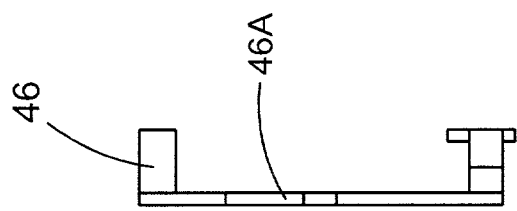
FIG. 17C shows the jumper shown in FIG. 17A as viewed in the direction of line 17C—17C.
Figure 17A:
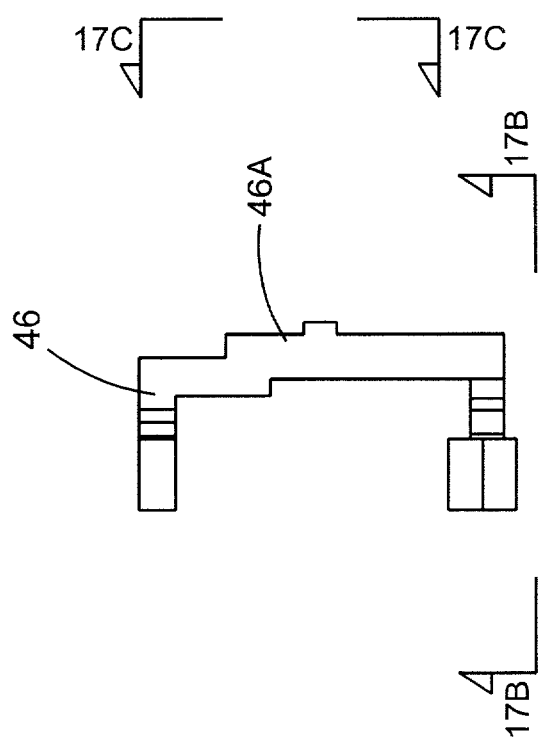
FIG. 17A shows a top plan view of a jumper used in a power module according to the first embodiment of the present invention.
Figure 17B:
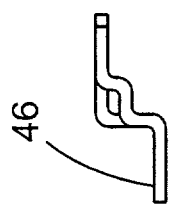
FIG. 17B shows the jumper shown in FIG. 17A viewed in the direction of line 17B—17B.

Referring to FIGS. 17A–17C, jumper 46 includes extension 46A which is disposed within the body of molded shell 12. As shown in FIG. 10, extension 46A is disposed over extensions 43A, 45A, 47A but under extensions 29, 41, thereby a more compact arrangement for the various components of the lead frame is realized.

Figure 18:
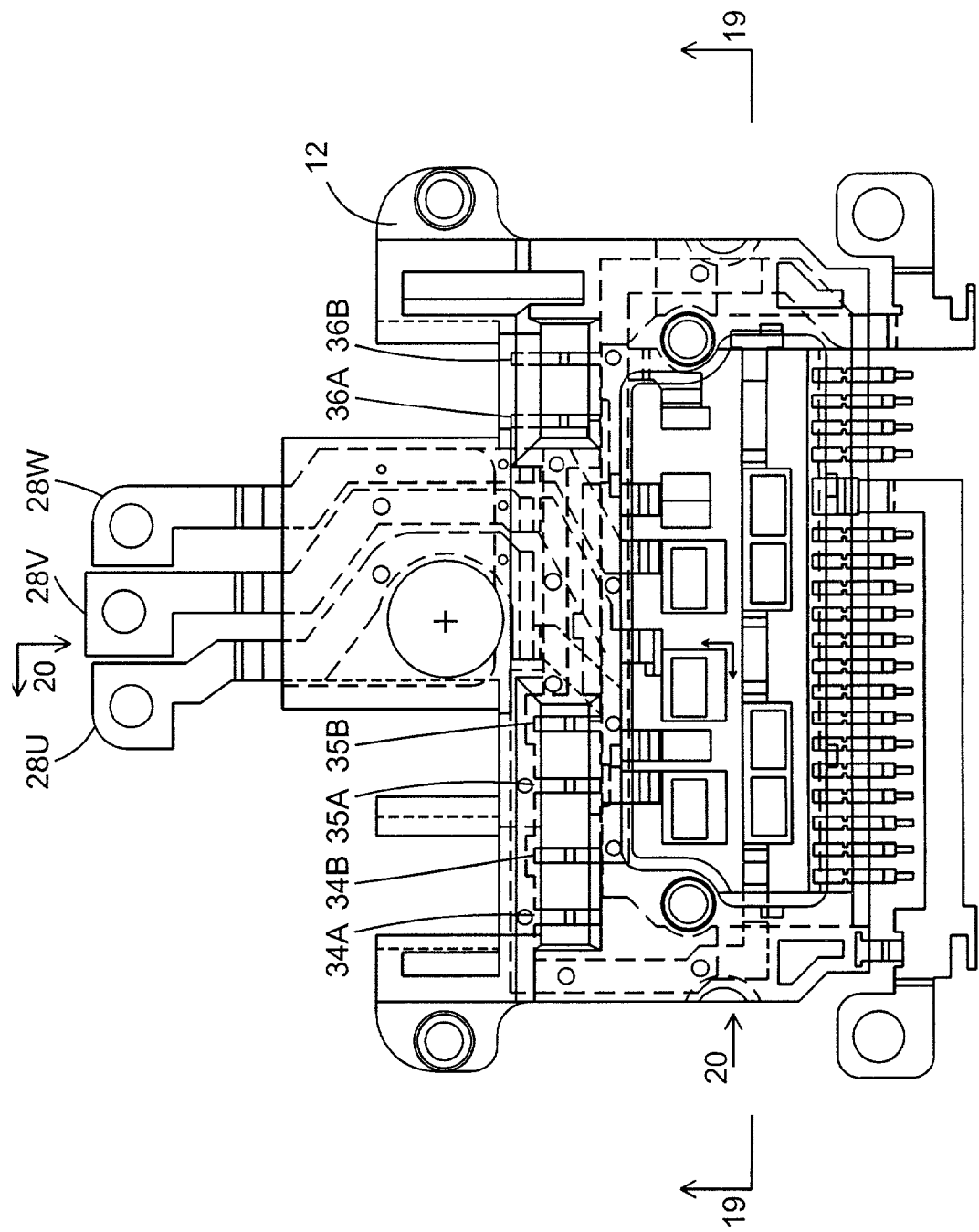
FIG. 18 shows a top plan view of a power module according to the first embodiment of the present invention in which the respective positions of the leads in the lead frame within the molded shell of the power module are shown by broken lines.

FIG. 18 shows the lead frame components, as illustrated by broken lines, within the body of molded shell 12. As shown in FIG. 18, openings are made in molded shell 12 to expose capacitor leads 34A, 34, B 35A, 35B, 36A, 36B, for electrical connection with bus capacitors 18, 20, 22.

Figure 19:
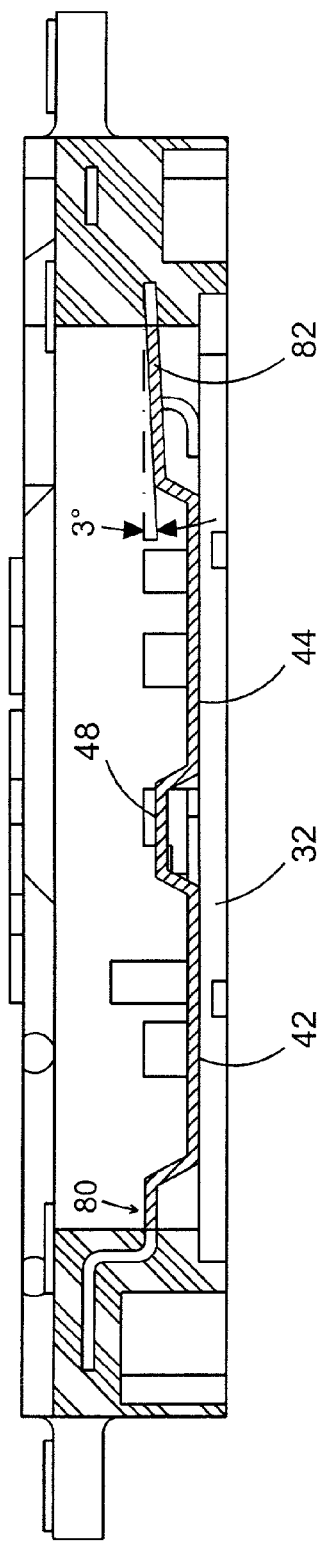
FIG. 19 shows a cross-sectional view of a power module according to the first embodiment of the present invention viewed in the direction of line 19—19 in FIG. 18.

FIG. 19 shows a cross-section of power module 10 as viewed in the direction of line 19—19 in FIG. 18. FIG. 19 shows bridge 48 and bridge portions 80, 82 which are used as discussed above for the purpose more compactly arranging the various components of power module 10.

Figure 20:
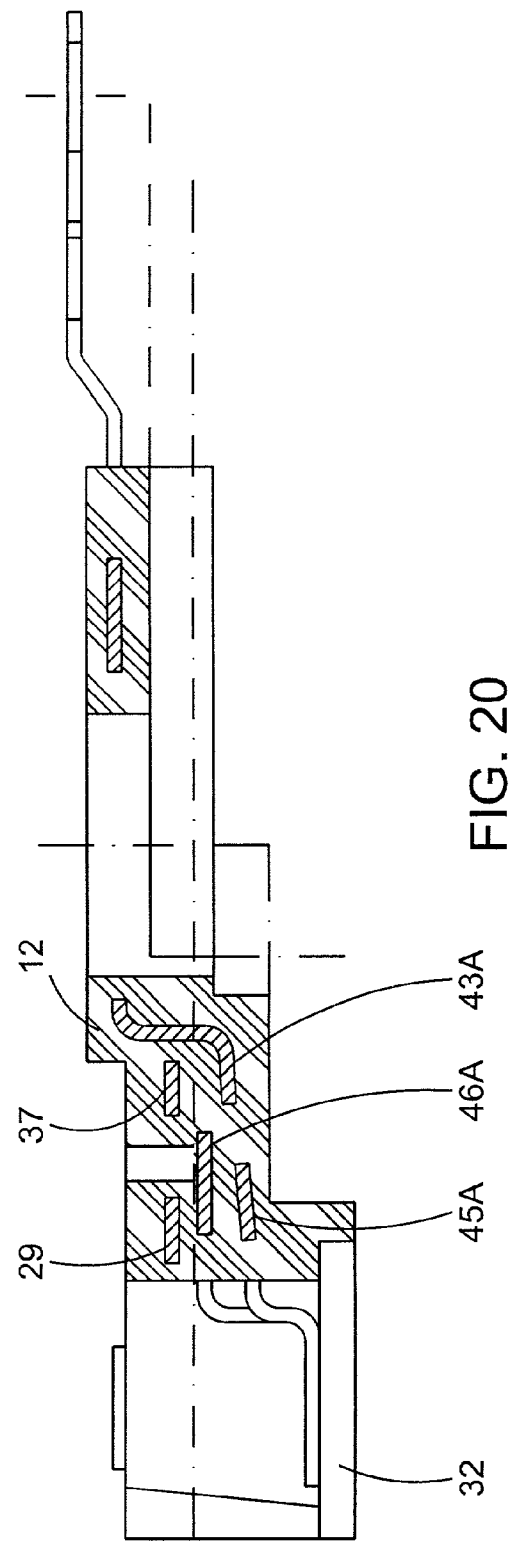
FIG. 20 shows a cross-sectional view of a power module according to the first embodiment of the present invention viewed in the direction of line 20—20 in FIG. 18.

FIG. 20 shows a cross-sectional view of power module 10 in which the relative positions of extensions 29, 37, 43, 45, 46A within the body of molded shell 12 are shown.

Figure 21:
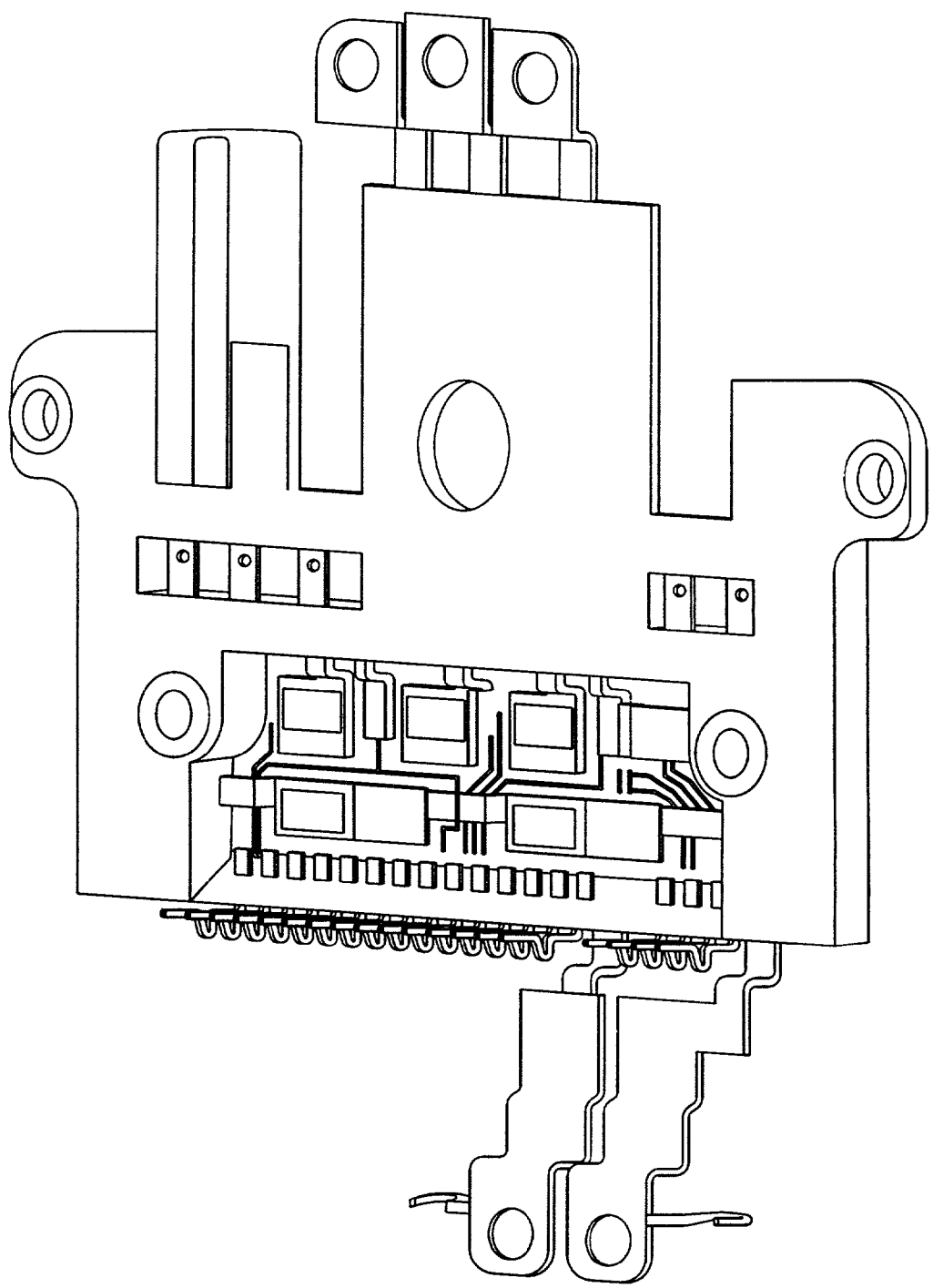
FIG. 21 shows a perspective view of the top of a power module according to the second embodiment of the present invention.

FIG. 21 shows a power module according to the second embodiment of the present invention. In this embodiment, power lead 24 does not include extension 23, thus bringing power lead 24 and ground lead 26 closer to one another.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:
1. A power module comprising:
   a molded power shell having an opening that extends between a top surface thereof and a bottom surface thereof;
   a substrate disposed at a bottom of said opening, said substrate having at least one conductive trace disposed on a major surface thereof; and a lead frame, said lead frame including at least one conductive pad having a power semiconductor die disposed on a major surface thereof, said conductive pad being integrally connected to an extension that extends from an edge of said conductive pad over said at least one conductive trace, a ground lead, a power lead, and at least a pair of leads extending outside said power shell, each lead being electrically connected to either said power lead or said ground lead and each directly coupled to a respective connector of a capacitor;

whereby said capacitor is directly assembled onto said power module.

2. A power module according to claim 1, wherein said extension is integrally connected to another conductive pad thereby forming a bridge over said conductive trace.

3. A power module according to claim 1, wherein said extension penetrates one of said walls of said opening.

4. A power module according to claim 1, wherein said pair of leads each includes an aperture that receives a respective connector of said capacitor.

5. A power module according to claim 1, further comprising a control pin in electrical contact with said conductive trace and extending through one of said walls of said opening to the exterior of said molded power shell, wherein said pin is connectable to a controller for controlling said power semiconductor device and said conductive trace is electrically connected to a control electrode of said power semiconductor device.

6. A power module according to claim 1, wherein said substrate is an insulated metal substrate.

7. A power module according to claim 1, wherein said lead frame includes a plurality of leads for making electrical connection to one phase winding of a multiphase motor, each one of said leads including a conductive pad integrally connected to an extension that extends through said power shell to the exterior of said power shell, each extension having a bent portion that bends downwardly, and at least one lead having a portion that passes through said power shell and over said bent portions.

8. A power module according to claim 7, further comprising a ground lead having a portion that passes through said molded power shell and over said bent portions.

9. A power module according to claim 8, further comprising a plurality of leads that extend at an angle from said portion of said ground lead that passes over said bent portions that form a plurality of pairs of leads connected to respective connectors of a plurality of capacitors with a plurality of leads that extend at an angle from said portion of said at least one lead that passes over said bent portions.

10. A power module according to claim 1, further comprising a jumper having two ends connected to respective conductive portions on said substrate and a portion between said two ends disposed within said molded power shell.

11. A power module comprising:
a molded shell having an opening that extends between a top surface thereof and a bottom surface thereof;
a substrate disposed at a bottom of said opening, said substrate having at least one conductive trace disposed on a major surface thereof;
a lead frame, said lead frame including at least one conductive pad having a power semiconductor die disposed on a major surface thereof;
a power lead;
a ground lead; and
a pair of leads extending from said molded shell, one lead electrically connected to said power lead and the other lead electrically connected to said ground lead, and each lead directly coupled to a respective connector of a capacitor;

whereby said capacitor is directly assembled onto said power module.

12. A power module according to claim 11, an extension integrally connected to and extending from an edge of said conductive pad over said at least one conductive trace.

13. A power module according to claim 11, wherein said pair of leads each includes an aperture that receives a respective connector of said capacitor.

14. A power module according to claim 11, further comprising a control pin in electrical contact with said conductive trace and extending through one of said walls of said opening to the exterior of said molded shell, wherein said pin is connectable to a controller for controlling said power semiconductor device and said conductive trace is electrically connected to a control electrode of said power semiconductor device.

15. A power module according to claim 11, wherein said substrate is an insulated metal substrate.

16. A power module according to claim 11, wherein said lead frame includes a plurality of leads for making electrical connection to one phase winding of a multiphase motor, each one of said leads including a conductive pad integrally connected to an extension that extends through said molded shell to the exterior of said molded shell, each extension having a bent portion that bends downwardly, and at least one lead having a portion that passes through said molded shell and over said bent portions.

17. A power module according to claim 16, further comprising a ground lead having a portion that passes through said molded power shell and over said bent portions.

18. A power module according to claim 17, further comprising a plurality of leads that extend at an angle from said portion of said ground lead that passes over said bent portions that form a plurality of pairs of leads connected to respective connectors of a plurality of capacitors with a plurality of leads that extend at an angle from said portion of said at least one lead that passes over said bent portions.

19. A power module according to claim 11, further comprising a jumper having two ends connected to respective conductive portions on said substrate and a portion between said two ends disposed within said molded power shell.

20. A power module according to claim 11, wherein said extension is integrally connected to another conductive pad thereby forming a bridge over said conductive trace.

* * * * *